US012801813B2

(12) United States Patent
Narayanan et al.

(10) Patent No.: US 12,801,813 B2
(45) Date of Patent: Nov. 17, 2026

(54) ROW-BY-ROW CONVOLUTIONAL NEURAL NETWORKS

(71) Applicant: International Business Machines Corporation, Armonk, NY (US)

(72) Inventors: Pritish Narayanan, San Jose, CA (US); Geoffrey Burr, Cupertino, CA (US); Masatoshi Ishii, Yokohama (JP); HsinYu Tsai, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 637 days.

(21) Appl. No.: 18/373,951

(22) Filed: Sep. 27, 2023

(65) Prior Publication Data

US 2025/0103774 A1 Mar. 27, 2025

(51) Int. Cl.
*G06F 30/27* (2020.01)
*G06F 30/323* (2020.01)

(52) U.S. Cl.
CPC ............ *G06F 30/27* (2020.01); *G06F 30/323* (2020.01)

(58) Field of Classification Search
USPC ................................ 716/100, 101, 102, 103
See application file for complete search history.

(56) References Cited

U.S. PATENT DOCUMENTS 10,720,217 B1 7/2020 Tran
10,853,448 B1 12/2020 Shalev
11,445,157 B2 * 9/2022 Luo ........................ G06F 17/16
11,562,240 B2 1/2023 Tsai
2018/0046916 A1 2/2018 Dally
2018/0189643 A1 7/2018 Kim
2020/0057919 A1 2/2020 Lovin
(Continued)

FOREIGN PATENT DOCUMENTS

EP 3326115 A1 5/2018

OTHER PUBLICATIONS

Ricardo Tapiador-Morales, Event-based Row-by-Row Multi-convolution engine for Dynamic-Vision Feature Extraction on FPGA. (see section c, d, fig. 7). 2018 IEEE. pp. 7.
(Continued)

*Primary Examiner* — Brian Ngo
(74) *Attorney, Agent, or Firm* — Seed Intellectual Property Law Group LLP

(57) ABSTRACT

A system for implementing a row-by-row convolution neural network using an in-memory compute architecture. A controller is configured to manage generation of a plurality of output images. A filter memory is configured to store copies of each of a plurality of sets of image filters. A plurality of multiply-accumulate crossbar arrays is configured for the parallel computation of elements of the given row for each of the plurality of output images. A plurality of sets of steering circuits is coupled to a bank of capacitors and configured to steer currents generated by the plurality of multiply-accumulate crossbar arrays to corresponding capacitors of the bank of capacitors. A plurality of sets of comparator circuits are configured to pulse-width modulate a signal based on a voltage of a corresponding capacitor of the bank of capacitors. Peripheral circuitry is configured to output elements of the plurality of output images via pulse-width modulated signals.

20 Claims, 9 Drawing Sheets

(56) References Cited

U.S. PATENT DOCUMENTS

| | | | | |
|---|---|---|---|---|
| 2020/0117986 | A1 | 4/2020 | Burr et al. | |
| 2021/0151678 | A1* | 5/2021 | Lee | H10B 63/84 |
| 2021/0183073 | A1 | 6/2021 | Ali Akbarian | |
| 2021/0374546 | A1 | 12/2021 | Tsai et al. | |
| 2022/0076056 | A1 | 3/2022 | Aliabadi | |
| 2022/0351032 | A1* | 11/2022 | Chou | G11C 11/54 |
| 2024/0037377 | A1* | 2/2024 | Shin | G06N 3/048 |

OTHER PUBLICATIONS

Peter Mell and Timothy Grance, The NIST Definition of Cloud Computing, NIST Special Publication 800-145, Sep. 2011, cover, pp. i-iii and 1-3.

* cited by examiner

ROW-BY-ROW CONVOLUTIONAL NEURAL NETWORKS

BACKGROUND

The present invention relates generally to the electrical, electronic and computer arts and, more particularly, to machine learning and neural networks.

Convolution layers are widely used in deep learning, usually to extract features in, for example, image processing tasks. The nature of convolution layers requires significant weight re-use. Conventional digital hardware can benefit from this re-use, amortizing the cost of bringing the weights from external memory into the processor, and then completing all the computations associated with those weights. On the other hand, naïve mapping of Convolution Neural Network (CNN) weights onto in-memory compute fabrics, such as analog crossbar arrays, results in poor array utilization and significant re-arrangement of activations between stages, leading to poor throughput.

To overcome these issues, a row-by-row convolution neural network scheme has been proposed. This scheme uses multiple copies of the same neural network weights, and careful arrangement of these multiple weight copies to process an entire input row in a given time step. Conventional techniques have described the row-by-row concept for both machine learning inferencing and training.

BRIEF SUMMARY

Principles of the invention provide techniques for row-by-row convolutional neural networks. In one aspect, an exemplary system for implementing a row-by-row convolution neural network using an in-memory compute architecture comprises a controller configured to manage generation of a plurality of output images; a filter memory configured to store m copies of each of a plurality of sets of image filters where m is a count of elements of a given row of a given output image of the plurality of output images; a plurality of multiply-accumulate crossbar arrays coupled to the filter memory and configured for the parallel computation of elements of the given row for each of the plurality of output images; a bank of capacitors coupled to the plurality of multiply-accumulate crossbar arrays; a plurality of sets of steering circuits coupled to the bank of capacitors and configured to steer currents generated by the plurality of multiply-accumulate crossbar arrays to corresponding capacitors of the bank of capacitors; a plurality of sets of comparator circuits coupled to the bank of capacitors and configured to pulse-width modulate a signal based on a voltage of a corresponding capacitor of the bank of capacitors; and peripheral circuitry coupled to the plurality of sets of comparator circuits and configured to output elements of the plurality of output images via the pulse-width modulated signals.

In one aspect, a hardware description language (HDL) design structure is encoded on a machine-readable data storage medium, the HDL design structure comprising elements that when processed in a computer-aided design system generates a machine-executable representation of a semiconductor structure, wherein the HDL design structure comprises a controller configured to manage generation of a plurality of output images; a filter memory configured to store m copies of each of a plurality of sets of image filters where m is a count of elements of a given row of a given output image of the plurality of output images; a plurality of multiply-accumulate crossbar arrays coupled to the filter memory and configured for the parallel computation of elements of the given row for each of the plurality of output images; a bank of capacitors coupled to the plurality of multiply-accumulate crossbar arrays; a plurality of sets of steering circuits coupled to the bank of capacitors and configured to steer currents generated by the plurality of multiply-accumulate crossbar arrays to corresponding capacitors of the bank of capacitors; a plurality of sets of comparator circuits coupled to the bank of capacitors and configured to pulse-width modulate a signal based on a voltage of a corresponding capacitor of the bank of capacitors; and peripheral circuitry coupled to the plurality of sets of comparator circuits and configured to output elements of the plurality of output images via the pulse-width modulated signals.

As used herein, "facilitating" an action includes performing the action, making the action easier, helping to carry the action out, or causing the action to be performed. Thus, by way of example and not limitation, instructions executing on a processor might facilitate an action carried out by, for example, semiconductor fabrication equipment, a remote processor, or the like, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

- an end-to-end analog computing circuit framework implementing key functions of row-by-row convolution for realizing high throughput in inferencing; and
- a high throughput, low energy, end-to-end scheme with minimal digital processing, useful in edge computing hardware for image classification or other tasks where convolution neural networks are used.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1A:
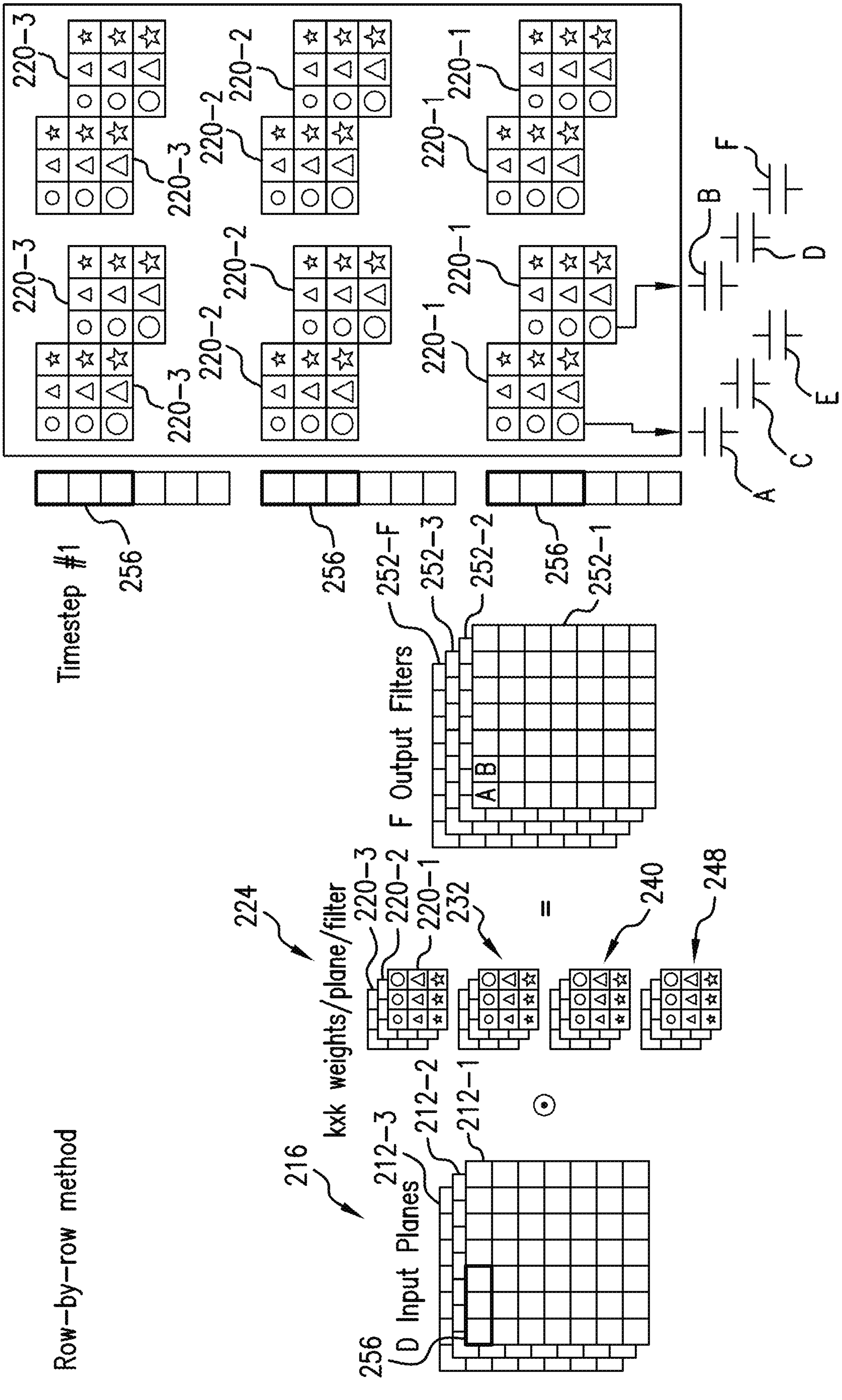
FIGS. 1A-1C illustrate each step in an example row-by-row method for generating a convolution layer for a CNN, in accordance with an example embodiment.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Generally, an end-to-end framework for implementing convolution layers on analog crossbar arrays is disclosed. Conventional techniques have described a row-by-row concept for implementing convolution layers for both inferencing and training. However, one or more embodiments advantageously provide an end-to-end analog computing circuit framework implementing pertinent functions of row-by-row convolution for realizing maximum throughput in inference. In one or more embodiments, the row-by-row convolutional neural network can be optimized for high throughput, using deep pipelining with redundant hardware infrastructure to accumulate several partial output values at each time step.

In one example embodiment, current steering circuits configured for accumulating partial sums from different time-steps, an implementation of the neural network (NN) activation function, and a mechanism for accomplishing max- or average-pooling are provided. Pooling is accomplished, for example, in the duration domain, by merging output durations from different columns on a two-dimensional (2D) routing mesh. In one or more embodiments, a cyclical scheme allows sharing/re-use of the same circuit components over multiple time-steps.

Since, in one or more instances, only one output is produced every K cycles in the row-by row technique (where K is the convolution kernel size), K copies of the weights are used with 2*K storage elements for a fully pipelined implementation with maximum throughput.

In one example embodiment, analog crossbar adders are used to perform computations with two-dimensional (2D) constructs. Neural network weights are stored in analog devices, and multiply-accumulate operations are performed in the crossbar adders according to Ohm's Law and Kirchhoff's Law. The mapping of three-dimensional (3D) computations to the 2D crossbar, without wasting the potential performance benefits, is pertinent and challenging, as is the implementation of the mapping in circuitry. The weights of the CNN are examined and appropriately mapped to the 2D crossbars. It is pertinent, in one or more embodiments, to properly combine the outputs of the crossbar adders and to rearrange the outputs of one layer of the CNN for input to the next layer of the CNN. The skilled artisan will be familiar with row-by-row mapping from, for example, US Patent Publication 2020-0117986 A1 of inventors Geoffrey Burr and Benjamin Killeen and assigned to International Business Machines Corporation and the University of Chicago, and given the teachings herein, will be able to implement one or more embodiments by adapting known techniques.

Figure 1B:
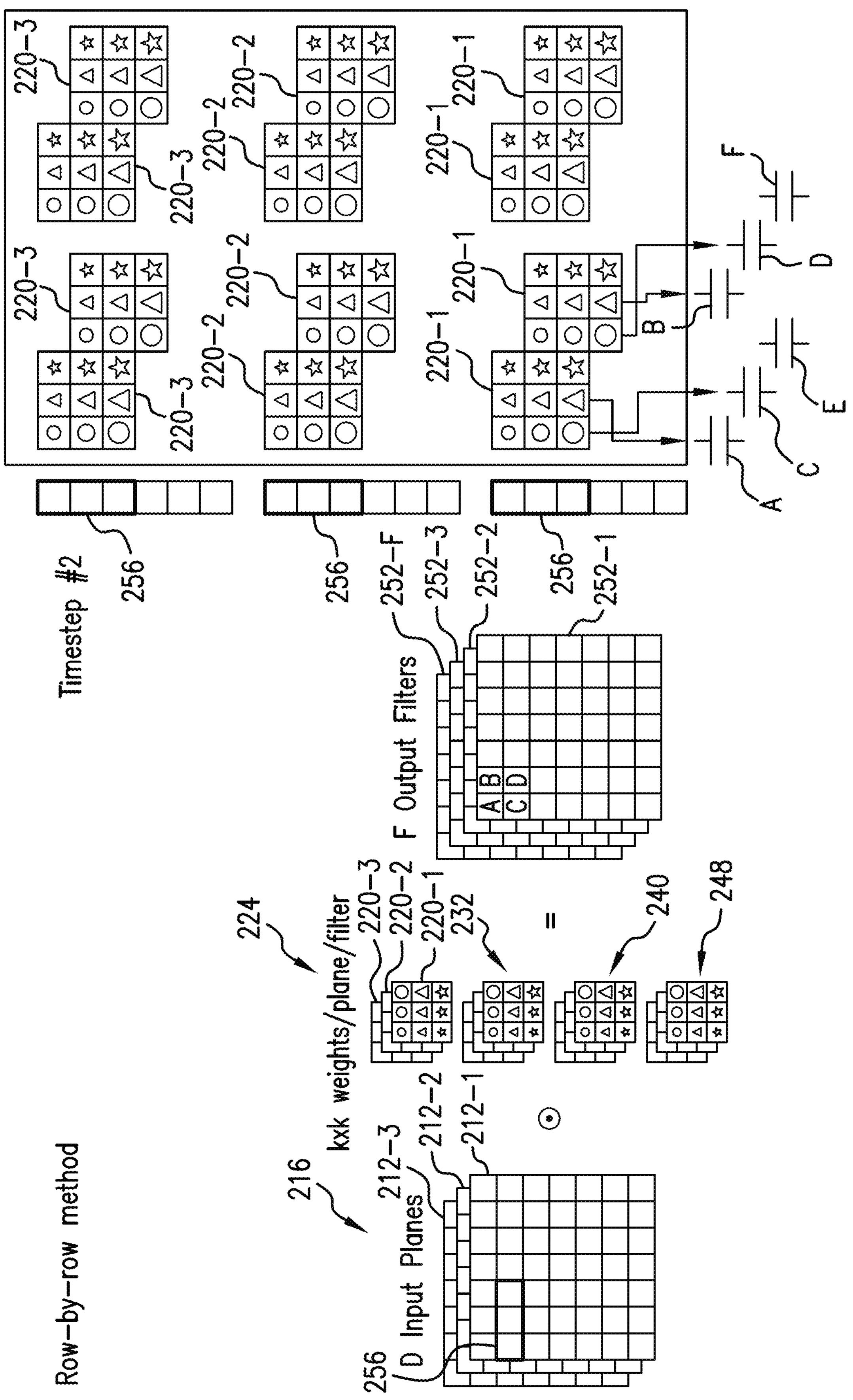
Figure 1C:
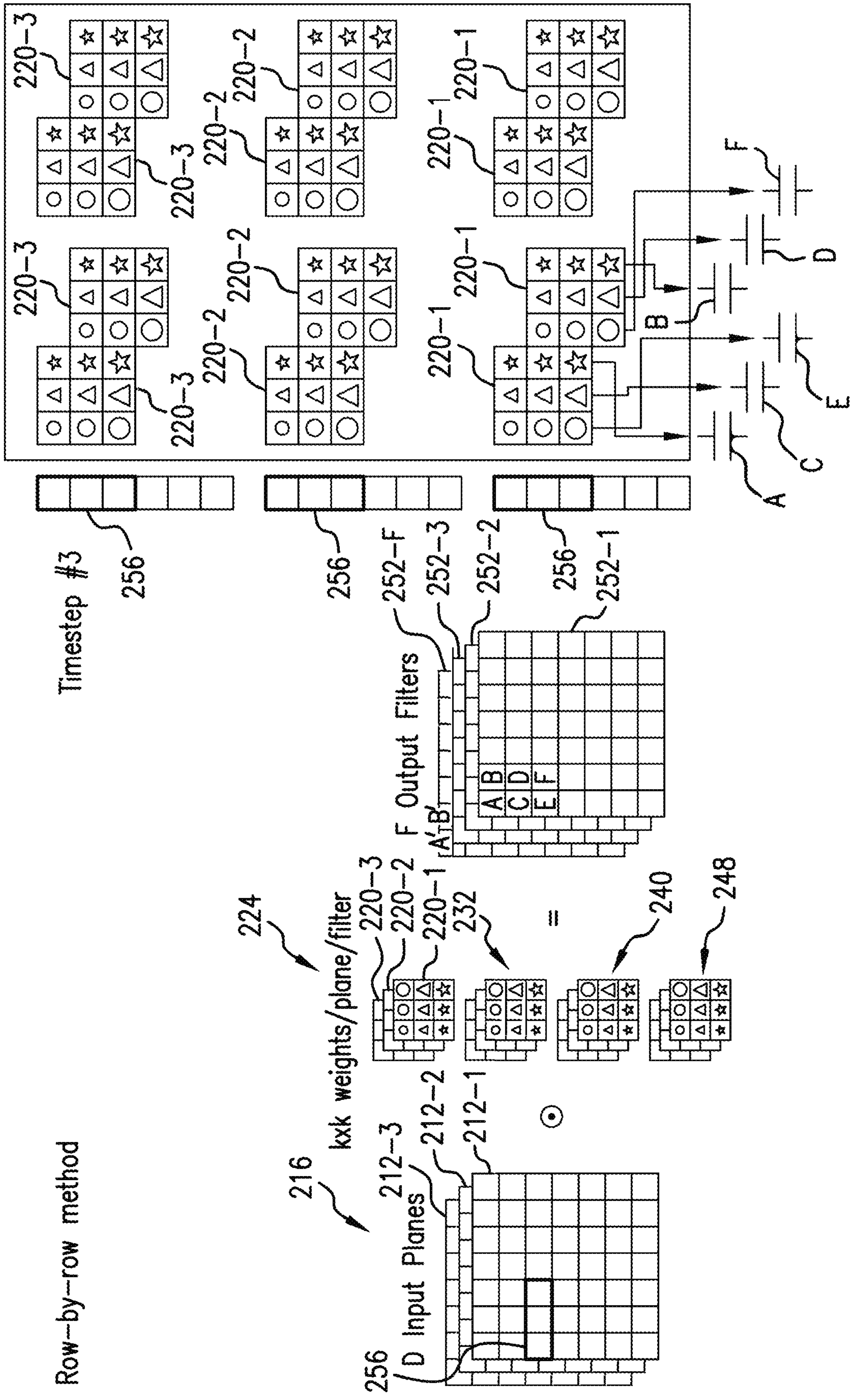

FIGS. 1A-1C illustrate each step in an example row-by-row method for generating a convolution layer for a CNN, in accordance with an example embodiment. In the example of FIGS. 1A-1C, a count of three input matrices 212-1, 212-2, 212-3, a sub-matrix size of 3×3, four sets of filters 224, 232, 240, 248 and a filter size of 3×3 are exemplary and other sizes and counts are contemplated. Considering a software implementation of the row-by-row technique, three RGB components 212-1 (red), 212-2 (green), 212-3 (blue) of an image 216 are processed to search for features in each of the three RGB components 212-1, 212-2, 212-3. A convolution operation is performed between a subgroup (sub-matrix) of pixels, such as a 3×3 sub-matrix, of each RGB component 212-1, 212-2, 212-3 with a corresponding filter 220-1, 220-2, 220-3 of a corresponding set of filters 224. (It is noted that the circles, triangles, and stars in the set of filters 224 represent the values of the elements of the filters.) As illustrated in FIG. 1A, a first set of filters 224 is used to produce a first output image 252-1, a second set of filters 232 is used to produce a second output image 252-2, a third set of filters 240 is used to produce a third output image 252-3, and a fourth set of filters 248 is used to produce a fourth output image 252-F.

To compute element A, the 3×3 sub-matrix in the top, left corner of the RGB component 212-1 is processed with filter 220-1, where the elements of the first row of the 3×3 sub-matrix (as indicated by boxes 256 of FIG. 1A) are multiplied with the corresponding elements of the first column of the filter 220-1, the elements of the second row of the 3×3 sub-matrix (as indicated by boxes 256 of FIG. 1B) are multiplied with the corresponding elements of the second column of the filter 220-1, and the elements of the third column of the 3×3 sub-matrix (as indicated by boxes 256 of FIG. 1C) are multiplied with the corresponding elements of the third column of the filter 220-1, to produce 9 scalars. The procedure is repeated for RGB component 212-2 with filter 220-2 and for RGB component 212-3 with filter 220-3 to produce a total of 27 scalars. The 27 scalars are then summed to produce element A of output image 252-1.

Next, the 3×3 sub-matrix template in the top, left corner of the RGB component 212-1 is moved one column to the right and the same procedure is followed to produce element B of output image 252-1. This process continues until all elements of the first row of the output image 252-1 are determined.

Next, the 3×3 sub-matrix template of the RGB component 212-1 is placed such that the upper, left-most element of the 3×3 sub-matrix template is positioned at row 2, column 1 of the RGB component 212-1 (similarly for RGB component 212-2 with filter 220-2 and for RGB component 212-3 with filter 220-3) and the same procedure is followed to produce the element below element A. This process continues until all elements of all the rows of the output image 252-1 are determined.

The skilled artisan will recognize that at the boundaries of an RGB component 212-1, 212-2, 212-3, the terms may be virtually "padded" with zero values. The skilled artisan would recognize that the number of rows of padding above the image, the number of rows of padding below the image, the number of columns of padding to the left of the image, and the number of columns of padding to the right of the image can range from zero to k−1, where k is the number of rows of the sub-matrix template. For example, with a 3×3 sub-matrix template, two rows/columns of padding may be added on each side of the image. In effect, this means that the multiply-accumulate is completed with two terms or one term, in the case of the 3×3 sub-matrix template. For example, the bottom two rows plus one virtual zero row are accessed for one MAC term, so only two real terms are needed in the MAC. The bottom row plus the two virtual zero rows is the final MAC term. In effect, when the bottom row is presented, the three capacitors already have the full MAC values associated with the virtual padded terms. The skilled artisan will recognize similar treatment of the top rows, the left-most columns and the right-most columns of the RGB components 212-1, 212-2, 212-3.

Such a set of convolution operations are repeated in parallel for each set of filters 224, 232, 240, 248 to produce the elements of F output images, where F is equal to the count of the sets of filters 224, 232, 240, 248.

Parallel Implementation

Figure 2:
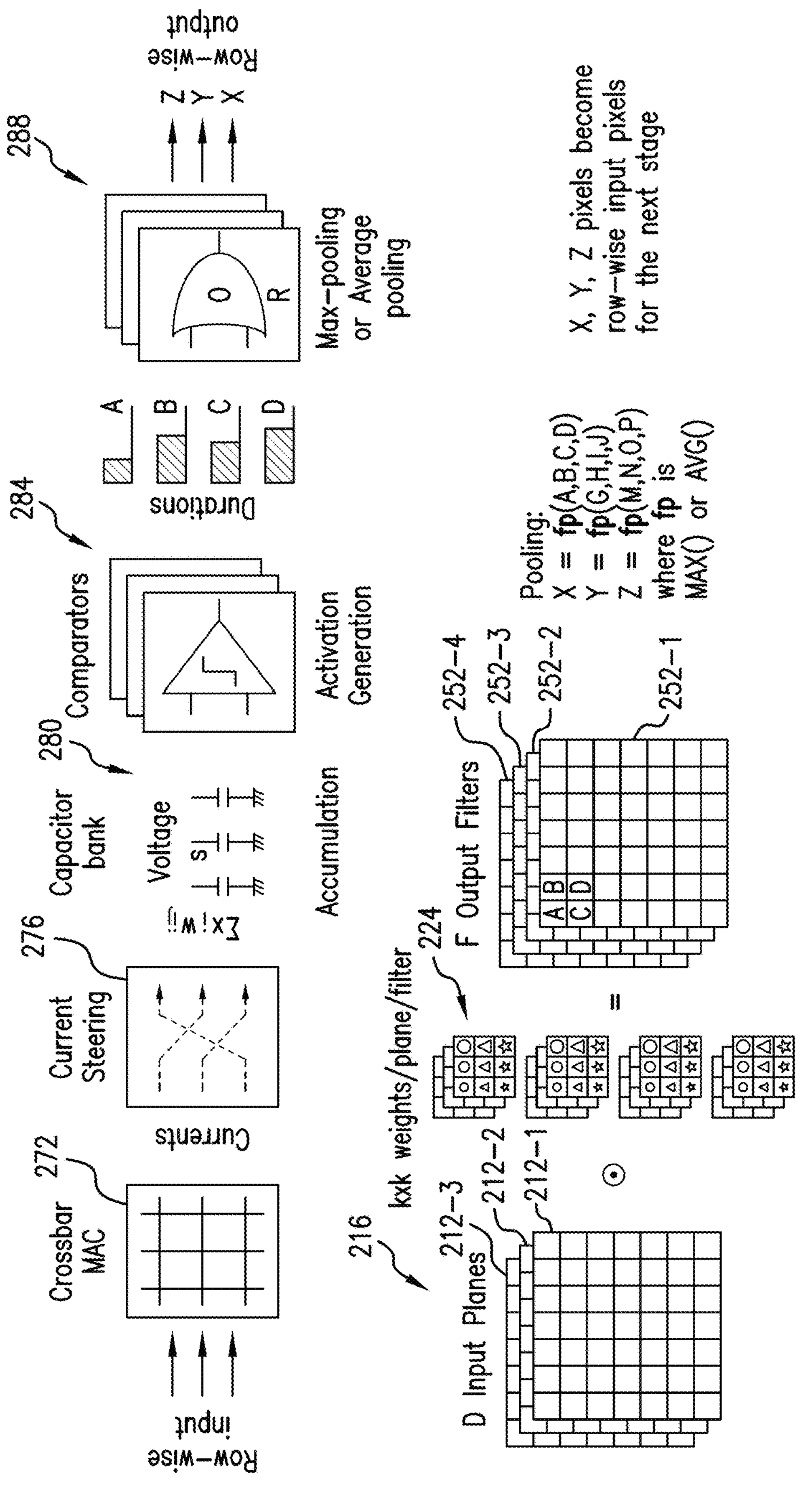
FIG. 2 is a high-level block diagram of an example hardware implementation of the row-by-row method for generating a convolution layer for a CNN, in accordance with an example embodiment.

FIG. 2 is a high-level block diagram of an example hardware implementation of the row-by-row method for generating a convolution layer for a CNN, in accordance with an example embodiment. In one example embodiment, the operations described above are mapped to multiply-accumulate crossbar arrays 272, current steering circuits 276, capacitor banks 280, and comparator circuits 284 for the parallel computation of the elements of one row of each of the output images 252-1, 252-2, 252-3, 252-F. Note that generally, there can be F filters—in the example embodiment of FIGS. 1A-1C and 2, F is 4, but F can take any value. This typically requires replicating each of the set of filters 224, 232, 240, 248 m times, where m equals the number of elements in one row of an output image, such as the output image 252-1 and providing a multiply-accumulate crossbar array 272 for each filter of the set of filters 224, 232, 240, 248. Thus, when one row of each of the RGB components 212-1, 212-2, 212-3 are obtained in parallel, the multiplication operations may be simultaneously performed in parallel for each of the k×k sub-matrices and for each of the filters of the set of filters 224, 232, 240, 248 required for computing the component terms of each element of the given row of the output images 252-1, 252-2, 252-3, 252-F (again, generally, F; here, F=4).

Then, as illustrated in FIG. 1A, the values (e.g., A, B) in the first column of each available sub-matrix are used to charge a corresponding capacitor, such as capacitor A, capacitor B, and so on (the other capacitors are discussed below), during a first time step; this serves to compute a portion of a corresponding element of a first row of the corresponding output image 252-1, 252-2, 252-3, 252-F (again, generally, F; here, F=4). In the example of FIG. 1A, the portion computed includes the contribution from the first column of the sub-matrix of the RGB component 212-1, the first column of the sub-matrix of the RGB component 212-2, and the first column of the sub-matrix of the RGB component 212-3.

As illustrated in FIG. 1B, during a second time step, the values in the second column of each available sub-matrix are used to charge the corresponding capacitor, such as capacitor A, capacitor B, and so on, in further computing a corresponding element for the same row of the corresponding output image 252-1, 252-2, 252-3, 252-F (again, generally, F; here, F=4). Simultaneously, the values in the first column of each available sub-matrix are used to charge the corresponding capacitor, such as capacitor C, capacitor D, and so on, for computing an element of a second row of the corresponding output image 252-1, 252-2, 252-3, 252-F (again, generally, F; here, F=4). As illustrated in FIG. 1C, during a third time step, the values in the third column of each available sub-matrix are used to charge the corresponding capacitor, such as capacitor A, capacitor B, and so on, in further computing a corresponding element for the same first row of the corresponding output image 252-1, 252-2, 252-3, 252-F. In addition, the values in the second column of each available sub-matrix are used to charge the corresponding capacitor, such as capacitor C, capacitor D, and so on, in further computing the corresponding element for the second row of the corresponding output image 252-1, 252-2, 252-3, 252-F (again, generally, F; here, F=4); and the values in the first column of each available sub-matrix are used to charge the corresponding capacitor, such as capacitor E, capacitor F, and so on, in computing a first portion of the corresponding element for the third row of the corresponding output image 252-1, 252-2, 252-3, 252-F.

At this point in time, the voltages of capacitors A, B, and so on represent the scalar of the corresponding element (such as element A, element B, and the like) in the first row of the corresponding output image 252-1, 252-2, 252-3, 252-F (again, generally, F; here, F=4). The voltages of capacitors C, D, and so on represent only a portion of the scalar of the corresponding element (such as element C, element D, and the like) in the second row of the corresponding output image 252-1, 252-2, 252-3, 252-F (again, generally, F; here, F=4) and the voltages of capacitors E, F, and so on represent only a portion of the scalar of the corresponding element (such as element E, element F, and the like) in the third row of the corresponding output image 252-1, 252-2, 252-3, 252-F (again, generally, F; here, F=4). The process continues, calculating all elements of all output images 252-1, 252-2, 252-3, 252-F (again, generally, F; here, F=4). The set of F output images 252-1, 252-2, 252-3, 252-F (again, generally, F; here, F=4) then constitute a layer of the CNN (of depth F).

As illustrated in FIG. 2, each filter weight is configured as a programmable conductance of the set of multiply-accumulate crossbar arrays 272. In one example embodiment, there are m multiply-accumulate crossbar arrays 272 for each filter of the set of filters 224, where m is a count of elements in one row of an output image 252-1, 252-2, 252-3, 252-F (again, generally, F; here, F=4). The currents produced by the multiply-accumulate crossbar arrays 272 are based on Ohm's Law of current equals voltage times conductance. As illustrated in FIGS. 1A-1C, the currents are summed along each column of the corresponding sub-matrix and each summed current is steered to the proper capacitor of capacitor bank 280, as illustrated in FIGS. 1A-1C. It is noted that the summing of currents not only includes the currents produced along each column of the corresponding sub-matrix of a filter in one of the sets of filters 224, but includes the currents produced along each column of the corresponding sub-matrix of all the filters in one of the sets of filters 224. The voltage produced by each capacitor is compared to a voltage ramp signal to generate a pulse-width modulation (PWM) signal for each element of the given row of the corresponding output image 252-1, 252-2, 252-3, 252-F (again, generally, F; here, F=4). The PWM signals generated by the set of comparator circuits 284 are provided as input to a next CNN layer.

Figure 3:
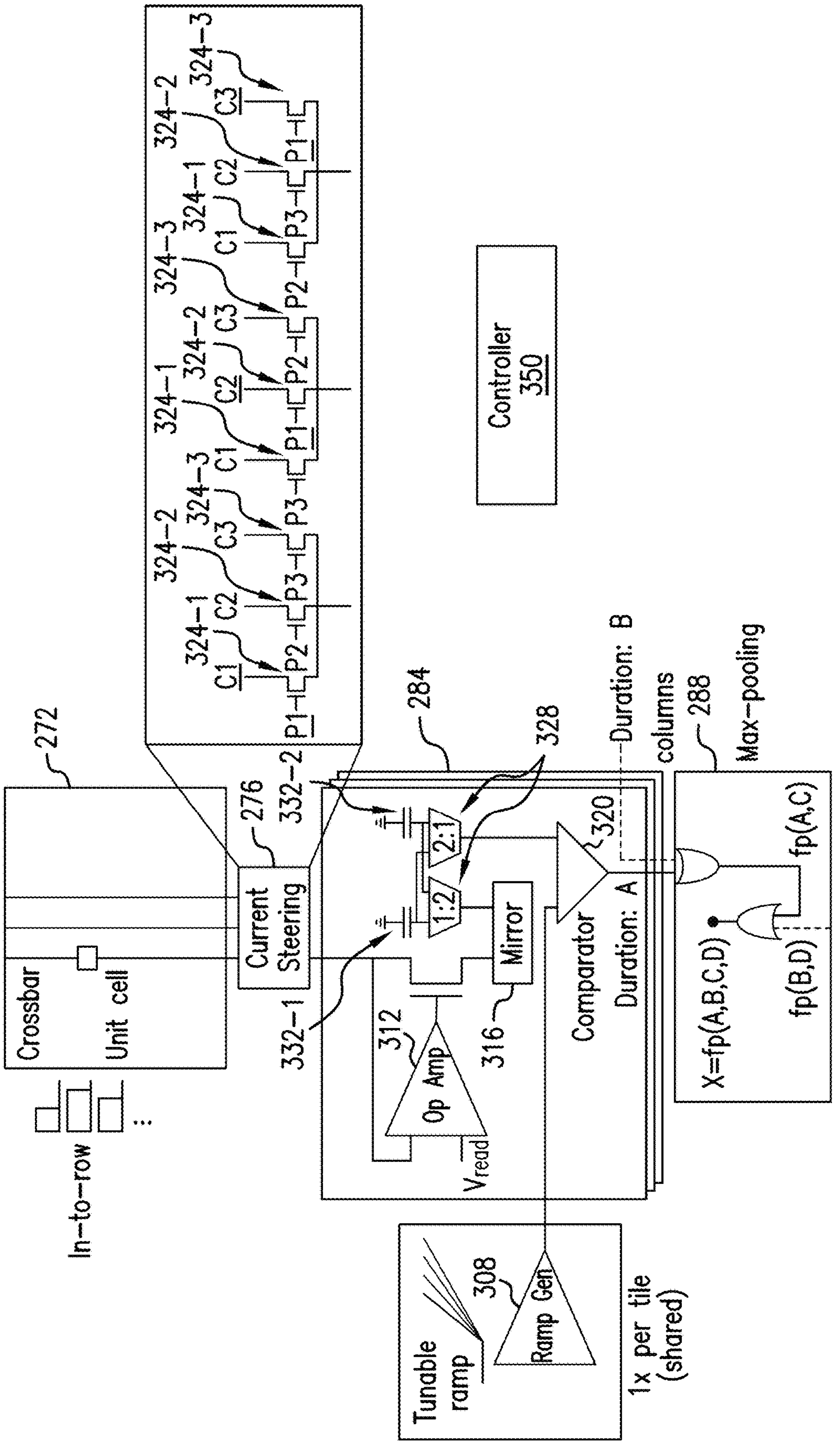
FIG. 3 is an illustration of a set of multiply-accumulate crossbar arrays, a set of current steering circuits, a set of comparator circuits, and a set of pooling circuits, in accordance with an example embodiment.

In some circumstances, multiple elements of each output image 252-1, 252-2, 252-3, 252-F (again, generally, F; here, F=4), such as elements A, B, C, D of FIG. 2, are combined via pooling. The combined value may be the average of the elements (such as the average of the elements A, B, C, D), the maximum of the elements A, B, C, D, and the like. In the example embodiment of FIG. 2, pooling is performed in the duration domain using the PWM signals generated by the set of comparator circuits 284. Since pooling consumes two different rows of an output image 252-1, 252-2, 252-3, 252-F (again, generally, F; here, F=4) (in the example of FIG. 2), and since the rows of each output image 252-1, 252-2, 252-3, 252-F (again, generally, F; here, F=4) are produced at different time steps, the elements may be stored for one time step to facilitate the pooling computation or redundant adders may be utilized to simultaneously generate the elements needed for the pooling computation. Also note the max-pooling or average pooling circuits 288, discussed further below. FIG. 3 is an illustration of a multiply-accumulate crossbar array 272, a set of current steering circuits 276, a set of comparator circuits 284, and a set of pooling circuits 288, in accordance with an example embodiment. In one example embodiment, each current steering circuit 276 is implemented by a set of metal-oxide semiconductor field-effect transistors (MOSFETS) 324-1, 324-2, 324-3. One transistor of each set of metal-oxide semiconductor field-effect transistors (MOSFETS) 324-1, 324-2, 324-3 is enabled at a time, allowing the current from a corresponding column of the corresponding multiply-accumulate crossbar array 272 to pass through to the corresponding capacitor of the capacitor bank 280. Each set of metal-oxide semiconductor field-effect transistors (MOSFETS) 324-1, 324-2, 324-3 is controlled by three control bits P1, P2, P3 that are activated and applied to the corresponding transistor gate in a round-robin manner.

In one example embodiment, a ramp generator 308 generates a ramp signal for a set of comparator circuits 284. A comparator 320 compares the voltage of the ramp signal with the voltage provided by the corresponding capacitor of the capacitor bank 280, thus generating a PWM version of the corresponding element of the corresponding output image 252-1, 252-2, 252-3, 252-F (again, generally, F; here, F=4).

Each comparator circuit 284 in combination with the ramp generator 308 constitutes a linear ramp generator and performs a proportional conversion from a voltage to a duration within the dynamic range of the circuits involved. If integration were to start at some mid-point voltage VM, and go either higher or lower, then the mid-point voltage VM represents a quantity equal to 0. The final voltage VF, if larger or smaller than VM, represents a positive or negative quantity. A rectified linear unit has the following function:

$$f(x) = x, \text{ for } x > 0;$$

$$f(x) = 0, \text{ for } x \leq 0.$$

In this case, starting a ramp at mid-point voltage VM and increasing it linearly essentially implements a rectified linear activation function (ReLU), since no durations are generated for any VF<VM, and proportionally increasing durations are produced for VF>VM. Other shapes of ramps, such as using lookup tables and digital-to-analog converters, can implement other activation functions. Generally, the shape of the waveform generated by the ramp will be the functional inverse of the activation function being implemented.

In one example embodiment, operational amplifier (Op Amp) 312 maintains a constant read voltage for a corresponding comparator circuit 284. Mirror circuitry 316 mirrors the current to the capacitor 332-1. Multiplexors 328 allow additional pipelining, accumulating a first partial MAC for row four using the second capacitor 332-2 while the output duration corresponding to the MAC from rows 1, 2, and 3 is being generated from the first capacitor 332-1.

In one example embodiment, each max pooling circuit 288 provides an OR logic function of the elements to be pooled, such as elements A, B, C, D. The PWM signal generated by each max pooling circuit 288 will represent the maximum value of the pooled elements.

It is noted that the elements of FIGS. 1A-1C, 3, and 4 may be implemented with digital and analog circuitry, as would be recognized by the skilled artisan. The system of FIGS. 1A-1C, 3, and 4 may be deployed as a hardware accelerator, an edge device, and the like.

Figure 4:
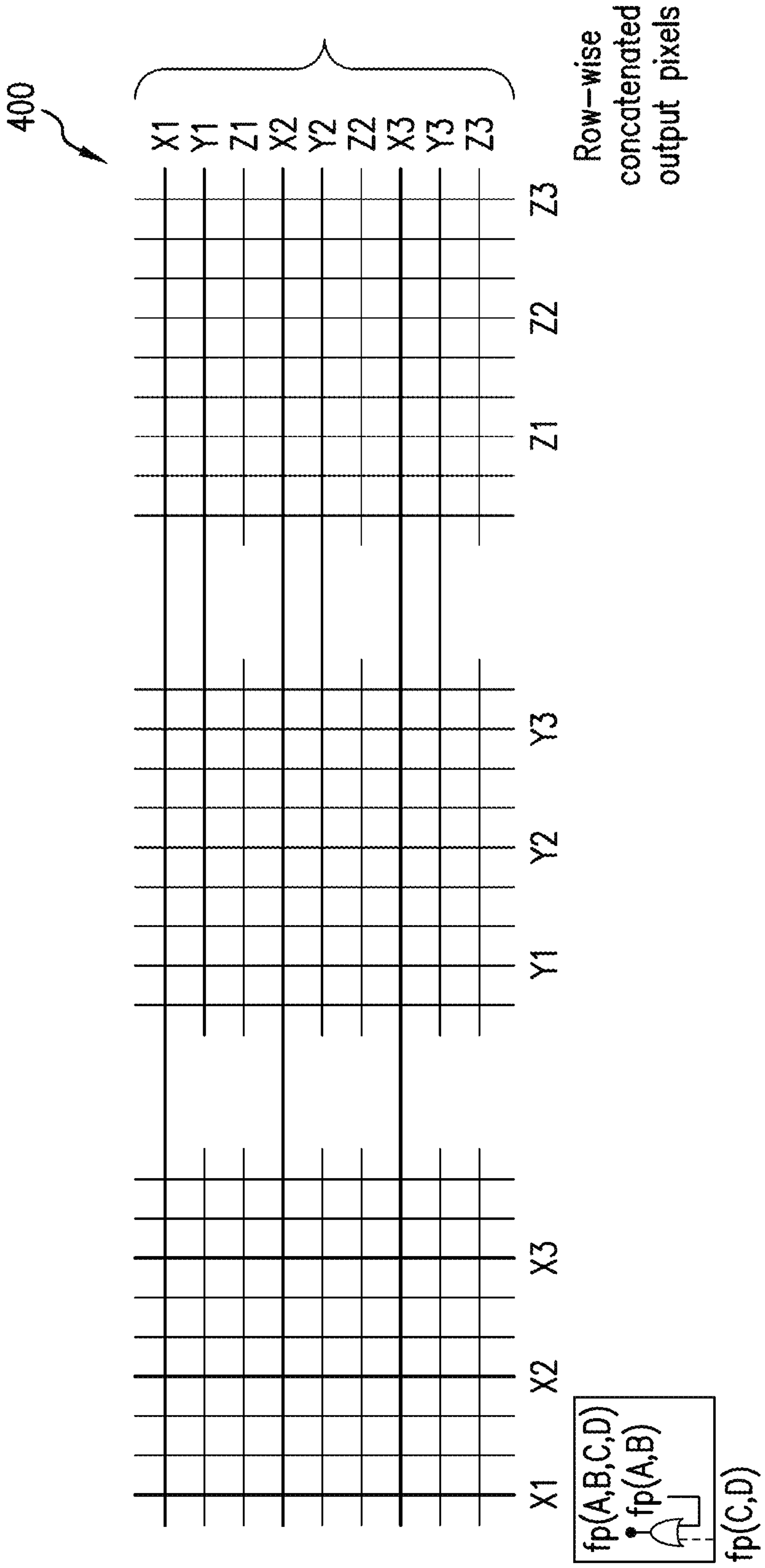
FIG. 4 is an illustration of an example routing mechanism, in accordance with an example embodiment.

FIG. 4 is an illustration of an example routing border guard mechanism 400, in accordance with an example embodiment. As illustrated in FIGS. 1A-1C, the circuits that generate each element of a row may not be physically located in the proper position for outputting the rows of the output image 252-1, 252-2, 252-3, 252-F (again, generally, F; here, F=4) and the elements should be routed to the appropriate location for output to the next convolutional layer of the CNN. In one example embodiment, each element of an output image 252-1, 252-2, 252-3, 252-F (again, generally, F; here, F=4), whether as generated by a comparator circuit 284 (if pooling is not invoked) or as generated by a pooling circuit (if pooling is invoked), such as a max pooling circuit 288, is routed to the appropriate position in an output row to be provided to the next layer of the CNN based on the current time step. This is accomplished via configuration bits for the router mechanism 400 that are activated in a round robin manner through k time steps. Thus, output pixels from different tiles can be concatenated together on a 2D routing mesh to generate 'row-wise' output that can be provided as the input for the next convolution layer.

Figure 5:
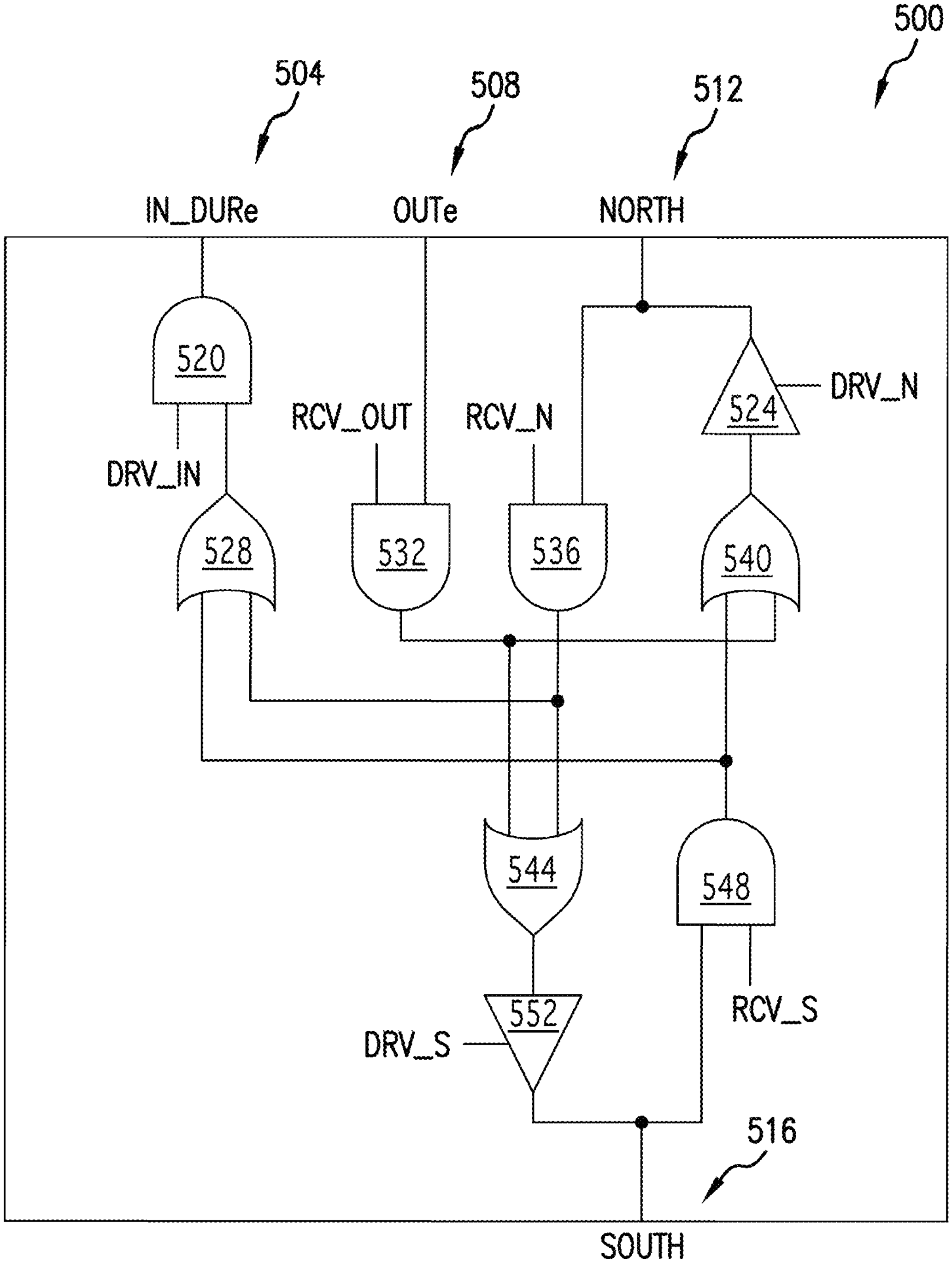
FIG. 5 is a circuit for a routing border guard, in accordance with an example embodiment.

FIG. 5 is a circuit for a routing border guard 400, in accordance with an example embodiment. The routing border guard 400 uses standard digital circuitry, including tri-state circuits. In one example embodiment, there are up to four input/output (I/O) ports through which duration signals can be passed. For instance, the south border guard has SOUTH I/O port 516 and NORTH I/O port 512 to interface signals into and out of the multiply-accumulate crossbar arrays 272, as illustrated in FIG. 5. Control signals determine the particular direction of driving data via the routing border guard 400. For instance, control signals RCV_S and DRV_N being active would mean a signal received on the south side is driven to the north side through the routing border guard 400. Combinations of valid control signals can be used for more complex routing. For instance, receiving from the array and driving signals both north and south. In FIG. 5, this would correspond to RCV_OUT, DRV_S, and DRV_N all being enabled.

Example routing behavior is described below. It is noted that the signal IN_DURe indicates sending a duration from the mesh into the peripheral circuitry and the signal OUTe indicates sending a duration from the peripheral circuitry to the mesh. The skilled artisan will be familiar with logic gates and their symbols as depicted in FIG. 5. As illustrated in FIG. 5, AND gate 520 inputs DRV_IN and generates IN_DURe based on the output of OR gate 528. AND gate 532 inputs RCV_OUT and OUTe. AND gate 536 performs an AND operation on signal RCV_N and signal NORTH. AND gate 548 performs an AND operation on signal RCV_S and signal SOUTH. Tri-state buffer 524 drives signal NORTH based on signal DRV_N and the output of OR gate 540, and tri-state buffer 552 drives signal SOUTH based on signal DRV_S and the output of OR gate 544.

Controller 350 controls the row-by-row processing of the input matrix 212-1, 212-2, 212-3 by the system of FIG. 3. Controller 350 can be implemented as a standard digital state machine or a stored program processor, as would be recognized by a skilled artisan. Connectivity of controller 350 to the components of FIG. 3 is omitted to avoid clutter, although the functions controlled by the controller 350 are described below. Controller 350 is responsible for orchestrating the flow of data through the multiply-accumulate crossbar arrays 272, including signaling that the multiply-accumulate crossbar arrays 272 is ready for the input of data, and setting control signals on the analog circuitry to decide phases 1, 2, and 3 of the current steering, integration on the appropriate capacitors, starting the linear ramp generator, enabling the comparators 284 to generate output durations, and setting the routing configuration bits. These are all accomplished by digital control signals driven by the controller 350 that reach each peripheral, essentially turning them ON or OFF through various switches.

In one example embodiment, the sequence of control generated by the controller 350 is:

1) enable integration operational-amplifier 312;
2) perform Phase 1 integration;
3) perform Phase 2 integration;
4) perform Phase 3 integration (columns 1, 4, 7, and the like are ready);
5) enable router 500 to transmit on columns 1, 4, 7, and the like;
6) enable comparators 284, and start linear ramp generator 308 (to generate a duration);
7) disable comparators 284, and disable linear ramp generator 308;
8) perform Phase 1 integration (columns 2, 5, 8, and the like are ready);
9) enable router 500 to transmit on columns 2, 5, 8, and the like;
10) enable comparators 284, and start linear ramp generator 308 (to generate a duration);
11) disable comparators 284, and disable linear ramp generator 308;
12) perform Phase 2 integration (columns 3, 6, 9, and the like are ready);
13) enable router 500 to transmit on columns 3, 6, 9, and the like;
14) enable comparators 284, and start linear ramp generator 308 (to generate a duration);
15) disable comparators 284, and disable linear ramp generator 308; and
16) repeat operations 4-15 for number of rows in the input image.

Given the discussion thus far, it will be appreciated that, in general terms, an exemplary system for implementing a row-by-row convolution neural network using an in-memory compute architecture, according to an aspect of the invention, includes a controller configured to manage generation of a plurality of output images 252-1, 252-2, 252-3, 252-F; a filter memory configured to store m copies of each of a plurality of sets of image filters 224, 232, 240, 248 where m is a count of elements of a given row of a given output image 252-1, 252-2, 252-3, 252-F of the plurality of output images 252-1, 252-2, 252-3, 252-F; a plurality of multiply-accumulate crossbar arrays 272 coupled to the filter memory and configured for the parallel computation of elements of the given row for each of the plurality of output images 252-1, 252-2, 252-3, 252-F; a bank of capacitors 280 coupled to the plurality of multiply-accumulate crossbar arrays 272; a plurality of sets of steering circuits 276 coupled to the bank of capacitors 280 and configured to steer currents generated by the plurality of multiply-accumulate crossbar arrays 272 to corresponding capacitors of the bank of capacitors 280; a plurality of sets of comparator circuits 284 coupled to the bank of capacitors 280 and configured to pulse-width modulate a signal based on a voltage of a corresponding capacitor of the bank of capacitors 280; and peripheral circuitry coupled to the plurality of sets of comparator circuits 284 and configured to output elements of the plurality of output images 252-1, 252-2, 252-3, 252-F via the pulse-width modulated signals.

In one example embodiment, each element of the given row for each of the plurality of output images 252-1, 252-2, 252-3, 252-F is calculated by the system over k time steps, where k is a count of columns in a k×k sub-matrix of a corresponding input matrix 212-1, 212-2, 212-3, wherein each multiply-accumulate crossbar array 272 is configured to simultaneously perform a multiplication of each element of a corresponding k×k sub-matrix of a corresponding input matrix 212-1, 212-2, 212-3 with a weight of a corresponding element of a corresponding image filter 220-1, 220-2, 220-3 of a corresponding set of image filters 224, 232, 240, 248 of the plurality of sets of image filters 224, 232, 240, 248, where n is a count of filters in each set of image filters 224, 232, 240, 248.

In one example embodiment, n×F steering circuits 276 of the plurality of steering circuits 276 are configured to steer a current produced by a corresponding one of the multiply-accumulate crossbar arrays 272 for a first column of the corresponding k×k sub-matrix to a corresponding capacitor of the bank of capacitors 280 during a first time step, steer a current produced by the corresponding multiply-accumulate crossbar array 272 for a second column of the corresponding k×k sub-matrix to the corresponding capacitor of the bank of capacitors 280 during a second time step, and steer a current produced by the corresponding multiply-accumulate crossbar array 272 for the $N^{th}$ column of the corresponding k×k sub-matrix to the corresponding capacitor of the bank of capacitors 280 during an $N^{th}$ time step.

In one example embodiment, the system comprises a router 400 configured to route each pulse-width modulated signal to a corresponding output of the system.

In one example embodiment, at least one of the current steering circuits 276 comprises a set of metal-oxide semiconductor field-effect transistors (MOSFETS) 324-1, 324-2, 324-3, one transistor of each set of metal-oxide semiconductor field-effect transistors (MOSFETS) 324-1, 324-2, 324-3 being configured to be enabled at a time by the controller via a gate of each metal-oxide semiconductor field-effect transistors (MOSFETS) 324-1, 324-2, 324-3 and configured to allow a current from a corresponding column of the corresponding multiply-accumulate crossbar array 272 to pass through to a corresponding capacitor of the capacitor bank 280.

In one example embodiment, the system comprises a ramp generator 308 configured to generate a ramp signal for the set of comparator circuits 284, each comparator circuit 284 comprising a comparator 320 configured to compare a voltage of the ramp signal with a voltage provided by a corresponding capacitor of the capacitor bank 280 and wherein each pulse-width modulated (PWM) signal has a pulse whose pulse width is proportional to the voltage provided by the corresponding capacitor of the capacitor bank 280.

In one example embodiment, a shape of the ramp signal is modulated to implement a plurality of different activation functions, the different activation functions comprises sigmoid, tanh, and Rectified Linear Units (ReLU).

In one example embodiment, the system comprises a set of pooling circuits 288, each pooling circuit 288 comprising an OR circuit configured to generate a maximum value of pooled elements of the corresponding output image 252-1, 252-2, 252-3, 252-F.

In one example embodiment, the controller causes a pooling of P×P terms to be performed over two stages, wherein a first stage implements pooling between P output row neighbors, and a second stage implements pooling between P pooled-row terms using two sets of OR logic gates.

In one example embodiment, each layer of the convolutional neural network is configured with a corresponding output image 252-1, 252-2, 252-3, 252-F.

In one example embodiment, the system further comprises a pooling mechanism for performing max-pooling in a duration domain using the pulse-width modulated signals generated by the set of comparator circuits 284, wherein the max-pooling merges output durations from different columns representing multiple elements of each output image 252-1, 252-2, 252-3, 252-F and wherein a combined value is a maximum of the multiple elements.

In one example embodiment, the system further comprises a pooling mechanism for performing average-pooling in a duration domain using the pulse-width modulated signals generated by the set of comparator circuits 284, wherein the average-pooling merges output durations from different columns representing multiple elements of each output image 252-1, 252-2, 252-3, 252-F and wherein a combined value is an average of the multiple elements.

In one aspect, a hardware description language (HDL) design structure is encoded on a machine-readable data storage medium, the HDL design structure comprising elements that when processed in a computer-aided design system generates a machine-executable representation of a semiconductor structure, wherein the HDL design structure comprises a controller configured to manage generation of a plurality of output images 252-1, 252-2, 252-3, 252-F; a filter memory configured to store m copies of each of a plurality of sets of image filters 224, 232, 240, 248 where m is a count of elements of a given row of a given output image 252-1, 252-2, 252-3, 252-F of the plurality of output images 252-1, 252-2, 252-3, 252-F; a plurality of multiply-accumulate crossbar arrays 272 coupled to the filter memory and configured for the parallel computation of elements of the given row for each of the plurality of output images 252-1, 252-2, 252-3, 252-F; a bank of capacitors 280 coupled to the plurality of multiply-accumulate crossbar arrays 272; a plurality of sets of steering circuits 276 coupled to the bank of capacitors 280 and configured to steer currents generated by the plurality of multiply-accumulate crossbar arrays 272 to corresponding capacitors of the bank of capacitors 280; a plurality of sets of comparator circuits 284 coupled to the bank of capacitors 280 and configured to pulse-width modulate a signal based on a voltage of a corresponding capacitor of the bank of capacitors 280; and peripheral circuitry coupled to the plurality of sets of comparator circuits 284 and configured to output elements of the plurality of output images 252-1, 252-2, 252-3, 252-F via the pulse-width modulated sign.

Figure 6:
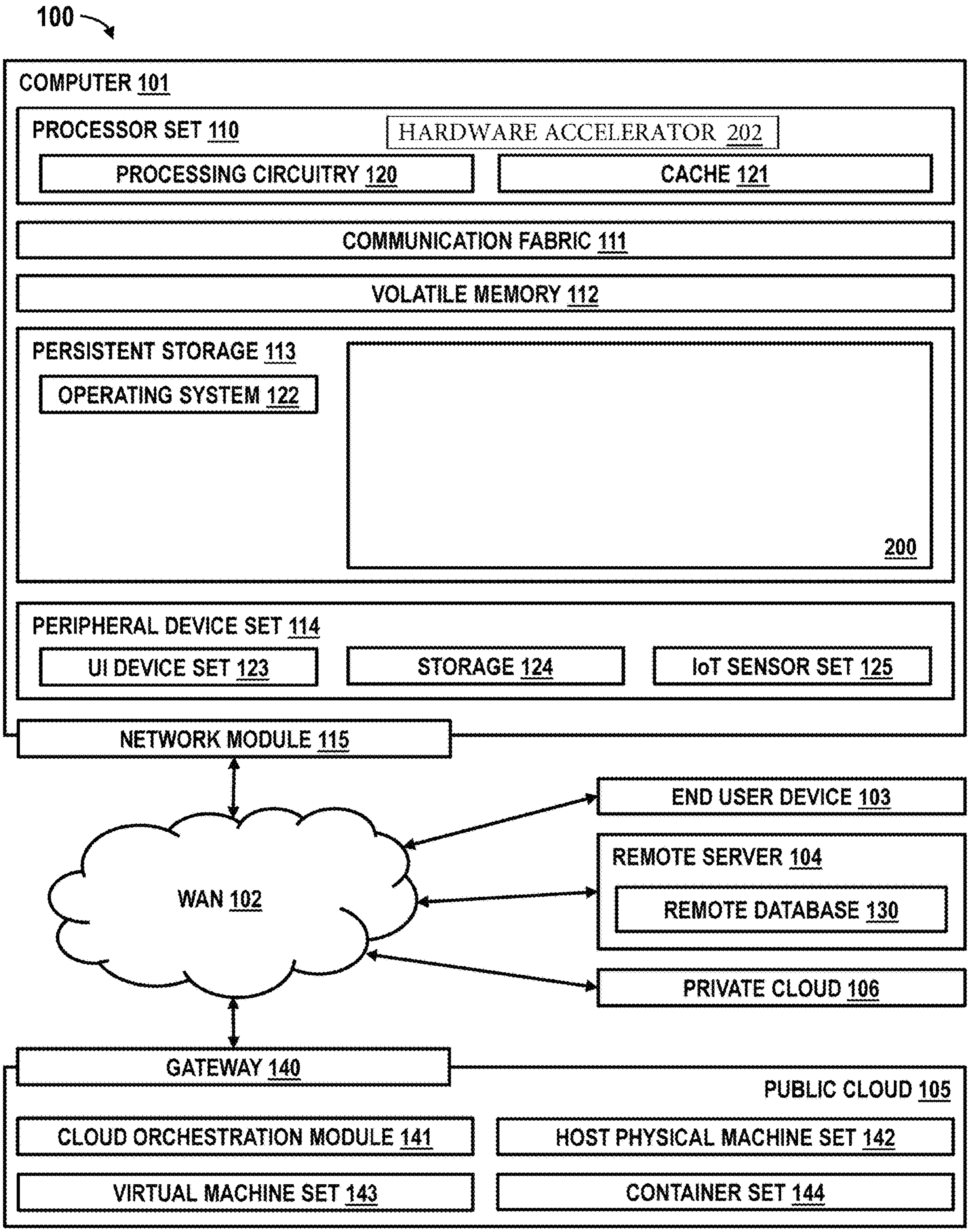
FIG. 6 depicts a computing environment according to an embodiment of the present invention (e.g., for implementing a design process such as that of FIG. 7)
Figure 7:
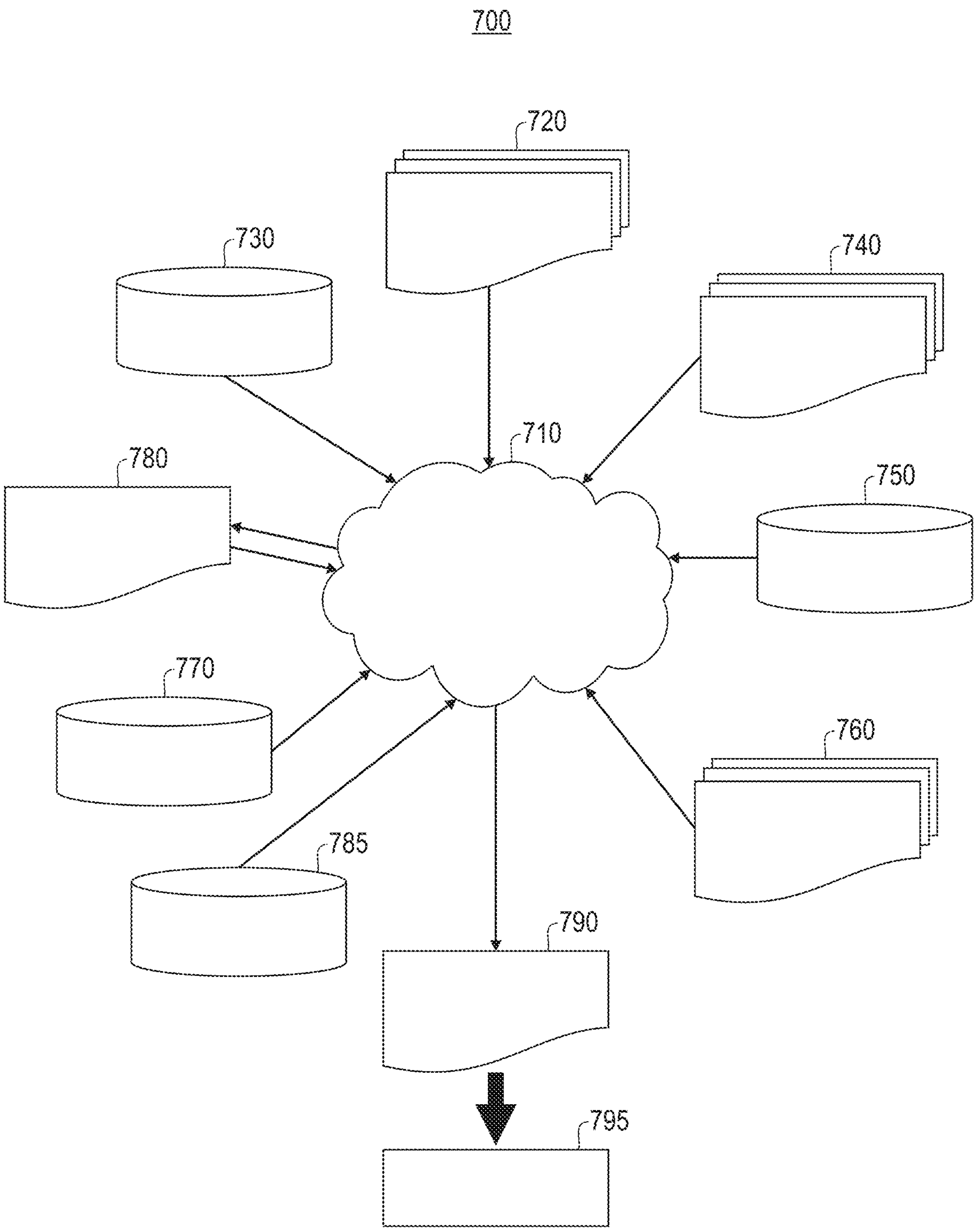
FIG. 7 is a flow diagram of a design process used in semiconductor design, manufacture, and/or test.

Reference should now be had to FIG. 6, which depicts a computing environment according to an embodiment of the present invention (e.g., for implementing a design process such as that of FIG. 7, also generally representative of a conventional, Von Neumann computing environment that could be modified to employ a hardware accelerator in accordance with aspects of the invention). A hardware accelerator 202 (hardware coprocessor) uses the specialized hardware techniques disclosed herein to accelerate multiply accumulate operations for neural networks, or the like. The elements 202 and 120 can connect to a suitable bus, for example, with suitable bus interface units.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a system 200 for semiconductor design and/or control of semiconductor fabrication (see FIG. 6, also, as noted, generally representative of a conventional, Von Neumann computing environment that could be modified to employ a hardware accelerator 202 in accordance with aspects of the invention). In addition to block 200, computing environment 100 includes, for example, computer 101, wide area network (WAN) 102, end user device (EUD) 103, remote server 104, public cloud 105, and private cloud 106. In this embodiment, computer 101 includes processor set

110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144. In one example embodiment, one or more MAX compute circuits 250 are integrated into a hardware accelerator 202 of the computer 100. As described above, the hardware accelerator 202 may be deployed to implement, for example, a Long Short-term Memory (LSTM) network.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 6. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test One or more embodiments make use of computer-aided semiconductor integrated circuit design simulation, test, layout, and/or manufacture. In this regard, FIG. 7 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A system for implementing a row-by-row convolution neural network using an in-memory compute architecture, the system comprising:

a controller configured to manage generation of a plurality of output images;

a filter memory configured to store m copies of each of a plurality of sets of image filters where m is a count of elements of a given row of a given output image of the plurality of output images;

a plurality of multiply-accumulate crossbar arrays coupled to the filter memory and configured for the parallel computation of elements of the given row for each of the plurality of output images;

a bank of capacitors coupled to the plurality of multiply-accumulate crossbar arrays;

a plurality of sets of steering circuits coupled to the bank of capacitors and configured to steer currents generated by the plurality of multiply-accumulate crossbar arrays to corresponding capacitors of the bank of capacitors;

a plurality of sets of comparator circuits coupled to the bank of capacitors and configured to pulse-width modulate a signal based on a voltage of a corresponding capacitor of the bank of capacitors; and peripheral circuitry coupled to the plurality of sets of comparator circuits and configured to output elements of the plurality of output images via the pulse-width modulated signals.

2. The system of claim 1, wherein each element of the given row for each of the plurality of output images is calculated by the system over k time steps, where k is a count of columns in a k×k sub-matrix of a corresponding input matrix, wherein each multiply-accumulate crossbar array is configured to simultaneously perform a multiplication of each element of a corresponding k×k sub-matrix of a corresponding input matrix with a weight of a corresponding element of a corresponding image filter of a corresponding set of image filters of the plurality of sets of image filters, where n is a count of filters in each set of image filters.

3. The system of claim 1, wherein n×F steering circuits of the plurality of steering circuits are configured to steer a current produced by a corresponding one of the multiply-accumulate crossbar arrays for a first column of the corresponding k×k sub-matrix to a corresponding capacitor of the bank of capacitors during a first time step, steer a current produced by the corresponding multiply-accumulate crossbar array for a second column of the corresponding k×k sub-matrix to the corresponding capacitor of the bank of capacitors during a second time step, and steer a current produced by the corresponding multiply-accumulate crossbar array for the $N^{th}$ column of the corresponding k×k sub-matrix to the corresponding capacitor of the bank of capacitors during an $N^{th}$ time step.

4. The system of claim 1, further comprising a router configured to route each pulse-width modulated signal to a corresponding output of the system.

5. The system of claim 1, wherein at least one of the current steering circuits comprises a set of metal-oxide semiconductor field-effect transistors (MOSFETS) 324-1, 324-2, 324-3, one transistor of each set of metal-oxide semiconductor field-effect transistors (MOSFETS) 324-1, 324-2, 324-3 being configured to be enabled at a time by the controller via a gate of each metal-oxide semiconductor field-effect transistors (MOSFETS) 324-1, 324-2, 324-3 and configured to allow a current from a corresponding column of the corresponding multiply-accumulate crossbar array to pass through to a corresponding capacitor of the capacitor bank.

6. The system of claim 1, further comprising a ramp generator configured to generate a ramp signal for the set of comparator circuits, each comparator circuit comprising a comparator configured to compare a voltage of the ramp signal with a voltage provided by a corresponding capacitor of the capacitor bank and wherein each pulse-width modulated (PWM) signal has a pulse whose pulse width is proportional to the voltage provided by the corresponding capacitor of the capacitor bank.

7. The system of claim 6, wherein a shape of the ramp signal is modulated to implement a plurality of different activation functions, the different activation functions comprising sigmoid, tanh, and Rectified Linear Units (ReLU).

8. The system of claim 1, further comprising a set of pooling circuits, each pooling circuit comprising an OR circuit configured to generate a maximum value of pooled elements of the corresponding output image.

9. The system of claim 8, wherein the controller causes a pooling of P×P terms to be performed over two stages, wherein a first stage implements pooling between P output row neighbors, and a second stage implements pooling between P pooled-row terms using two sets of OR logic gates.

10. The system of claim 1, wherein each layer of the convolutional neural network is configured with a corresponding output image.

11. The system of claim 1, further comprising a pooling mechanism for performing max-pooling in a duration domain using the pulse-width modulated signals generated by the set of comparator circuits, wherein the max-pooling merges output durations from different columns representing multiple elements of each output image and wherein a combined value is a maximum of the multiple elements.

12. The system of claim 1, further comprising a pooling mechanism for performing average-pooling in a duration domain using the pulse-width modulated signals generated by the set of comparator circuits wherein the average-pooling merges output durations from different columns representing multiple elements of each output image and wherein a combined value is an average of the multiple elements.

13. A hardware description language (HDL) design structure encoded on a machine-readable data storage medium, the HDL design structure comprising elements that when processed in a computer-aided design system generates a machine-executable representation of a semiconductor structure, wherein the HDL design structure comprises:

a controller configured to manage generation of a plurality of output images;

a filter memory configured to store m copies of each of a plurality of sets of image filters where m is a count of elements of a given row of a given output image of the plurality of output images;

a plurality of multiply-accumulate crossbar arrays coupled to the filter memory and configured for the parallel computation of elements of the given row for each of the plurality of output images;

a bank of capacitors coupled to the plurality of multiply-accumulate crossbar arrays;

a plurality of sets of steering circuits coupled to the bank of capacitors and configured to steer currents generated by the plurality of multiply-accumulate crossbar arrays to corresponding capacitors of the bank of capacitors;

a plurality of sets of comparator circuits coupled to the bank of capacitors and configured to pulse-width modulate a signal based on a voltage of a corresponding capacitor of the bank of capacitors; and peripheral circuitry coupled to the plurality of sets of comparator circuits and configured to output elements of the plurality of output images via the pulse-width modulated signals.

14. The hardware description language (HDL) design structure of claim 13, wherein each element of the given row for each of the plurality of output images is calculated by the system over k time steps, where k is a count of columns in a k×k sub-matrix of a corresponding input matrix, wherein each multiply-accumulate crossbar array is configured to simultaneously perform a multiplication of each element of a corresponding k×k sub-matrix of a corresponding input matrix with a weight of a corresponding element of a corresponding image filter of a corresponding set of image filters of the plurality of sets of image filters, where n is a count of filters in each set of image filters.

15. The hardware description language (HDL) design structure of claim 13, wherein n×F steering circuits of the plurality of steering circuits are configured to steer a current produced by a corresponding one of the multiply-accumulate crossbar arrays for a first column of the corresponding k×k sub-matrix to a corresponding capacitor of the bank of capacitors during a first time step, steer a current produced by the corresponding multiply-accumulate crossbar array for a second column of the corresponding k×k sub-matrix to the corresponding capacitor of the bank of capacitors during a second time step, and steer a current produced by the corresponding multiply-accumulate crossbar array for the $N^{th}$ column of the corresponding k×k sub-matrix to the corresponding capacitor of the bank of capacitors during an $N^{th}$ time step.

16. The hardware description language (HDL) design structure of claim 13, further comprising a router configured to route each pulse-width modulated signal to a corresponding output of the system.

17. The hardware description language (HDL) design structure of claim 13, wherein at least one of the current steering circuits comprises a set of metal-oxide semiconductor field-effect transistors (MOSFETS) 324-1, 324-2, 324-3, one transistor of each set of metal-oxide semiconductor field-effect transistors (MOSFETS) 324-1, 324-2, 324-3 being configured to be enabled at a time by the controller via a gate of each metal-oxide semiconductor field-effect transistors (MOSFETS) 324-1, 324-2, 324-3 and configured to allow a current from a corresponding column of the corresponding multiply-accumulate crossbar array to pass through to a corresponding capacitor of the capacitor bank.

18. The hardware description language (HDL) design structure of claim 13, further comprising a ramp generator configured to generate a ramp signal for the set of comparator circuits, each comparator circuit comprising a comparator configured to compare a voltage of the ramp signal with a voltage provided by a corresponding capacitor of the capacitor bank and wherein each pulse-width modulated (PWM) signal has a pulse whose pulse width is proportional to the voltage provided by the corresponding capacitor of the capacitor bank.

19. The hardware description language (HDL) design structure of claim 18, wherein a shape of the ramp signal is modulated to implement a plurality of different activation functions, the different activation functions comprising sigmoid, tanh, and Rectified Linear Units (ReLU).

20. The hardware description language (HDL) design structure of claim 13, further comprising a set of pooling circuits, each pooling circuit comprising an OR circuit configured to generate a maximum value of pooled elements of the corresponding output image.

* * * * *